(12) United States Patent
Trenne (10) Patent No.: US 7,572,153 B2
(45) Date of Patent: Aug. 11, 2009

(54) REVERSIBLE UNIVERSAL SERIAL BUS CONNECTION INTERFACE FOR USB CONNECTORS AND UNIVERSAL SERIAL BUS PORTS

(75) Inventor: Rodney J Trenne, 364 Chicago St., Salt Lake City, UT (US) 84116

(73) Assignee: Rodney J Trenne, Salt Lake City, UT (US)

( * ) Notice: Subject to any disclaimer, the term of this patent is extended or adjusted under 35 U.S.C. 154(b) by 0 days.

(21) Appl. No.: 12/156,691

(22) Filed: Jun. 4, 2008

(65) Prior Publication Data

US 2009/0011621 A1    Jan. 8, 2009

Related U.S. Application Data

(62) Division of application No. 11/404,975, filed on Apr. 14, 2006, now Pat. No. 7,387,539.

(51) Int. Cl.
*H01R 29/00* (2006.01)

(52) U.S. Cl. ...................... 439/660; 439/218

(58) Field of Classification Search ................. 439/660, 439/218, 217
See application file for complete search history.

(56) References Cited

U.S. PATENT DOCUMENTS

| 7,094,086 | B2* | 8/2006 | Teicher ................. 439/173 |
| 7,160,125 | B1* | 1/2007 | Teicher ................. 439/173 |
| 2006/0024997 | A1* | 2/2006 | Teicher ................. 439/217 |
| 2007/0049119 | A1* | 3/2007 | Fujimoto et al. ........ 439/610 |
| 2007/0072491 | A1* | 3/2007 | Huang ................... 439/660 |
| 2007/0202725 | A1* | 8/2007 | Teicher ................. 439/173 |
| 2007/0218762 | A1* | 9/2007 | Liao et al. ............. 439/607 |

* cited by examiner

*Primary Examiner*—Gary F. Paumen
(74) *Attorney, Agent, or Firm*—Michael D. Wiggins (57) ABSTRACT

A universal serial bus (USB) interface connection for one of a USB connector and a USB port of a device comprises an insulating substrate including a first side and a second side. First, second, third and fourth conductors are arranged adjacent to each other on the first side of the insulating substrate and have a port side and a second side. First, second, third and fourth conductors are arranged adjacent to each other on the second side of the insulating substrate and have a port side and a second side. The USB connector can be connected in first and second orientations.

6 Claims, 14 Drawing Sheets

REVERSIBLE UNIVERSAL SERIAL BUS CONNECTION INTERFACE FOR USB CONNECTORS AND UNIVERSAL SERIAL BUS PORTS

CROSS-REFERENCE TO RELATED APPLICATIONS

This application is a divisional of U.S. patent application Ser. No. 11/404,975 filed on Apr. 14, 2006. The disclosure of the above application is incorporated herein by reference.

FIELD

The present disclosure relates to electrical connectors and ports, and more particularly to universal serial bus (USB) connectors and ports.

BACKGROUND

The statements in this section merely provide background information related to the present disclosure and may not constitute prior art.

Most computers sold today include one or more Universal Serial Bus (USB) connectors. The USB connectors allow users to connect mice, printers, jump drives, microphones, USB cables, headsets, and other devices to the computer quickly and easily. The computers typically run an operating system (OS) that supports the USB to allow easy installation. As compared to other ways of connecting devices to the computer (including parallel ports, serial ports and custom cards installed inside the computer's case), the USB devices are relatively simple. If the USB device is a new device, the OS auto-detects the USB device and may initiate a dialog with the user to locate a driver for the USB device. If the USB device has already been installed, the computer activates the USB device.

A USB cable typically includes two wires for power (typically 5V (volts) and ground) and a twisted pair of wires to carry data. The USB cable may also be shielded. Low-power devices (such as mice and/or other devices) can draw their power directly from the USB connection. High-power devices (such as printers and/or other devices) have power supplies and draw minimal power from the USB connection. USB devices are hot-swappable, which means that they can be plugged and unplugged at any time.

The host computer powers up, queries all of the USB devices connected to the bus and assigns an address to each USB device. This process is called enumeration—USB devices are also enumerated when they are connected to the bus. The host computer determines the type of data transfer that the USB device employs. Devices such as mice or keyboards, which send relatively small amounts of data, tend to use an interrupt mode. Devices such as printers, which receive data in large packets, tend to use a bulk transfer mode. Data is sent to the printer in blocks and verified. Streaming devices (such as speakers) use an isochronous mode. Data streams between the device and the host in real-time without error correction.

SUMMARY

A universal serial bus (USB) connector comprises an insulating substrate including a first side and a second side. First, second, third and fourth conductors are arranged adjacent to each other on the first side of the insulating substrate and have a port side and a second side. First, second, third and fourth conductors are arranged adjacent to each other on the second side of the insulating substrate and have a port side and a second side.

In other features, the first conductor on the first side is adjacent to the fourth conductor on the second side, the second conductor on the first side is adjacent to the third conductor on the second side, the third conductor on the first side is adjacent to the second conductor on the second side, and the fourth conductor on the first side is adjacent to the first conductor on the second side.

In other features, the first conductors on the first and second sides are connected by the first connecting conductor, the second conductors on the first and second sides are connected by the second connecting conductor, the third conductors on the first and second sides are connected by the third connecting conductor, and the fourth conductors on the first and second sides are connected by the fourth connecting conductor.

In other features, the port side ends of the first conductors are tapered. The insulating substrate includes a printed circuit board. The first, second, third and fourth conductors include traces formed on first and second sides of the printed circuit board. The first, second, third and fourth connecting conductors include vias arranged in the printed circuit board. A housing includes a connector that receives the insulating substrate.

A system comprises the USB connector and further comprises a hard disk drive connected to the second ends of the first, second, third and fourth conductors.

A USB cable comprises the USB connector and further comprises first, second, third and fourth wires that are connected to the first, second, third and fourth conductors.

A system comprises the USB connector and further comprises a circuit connected to the second ends of the first, second, third and fourth conductors.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Conventional USB connectors must be connected to USB ports in a particular orientation. In other words, the USB connectors cannot be rotated 180 degrees and connected in a second orientation. If a user attempts to connect the USB connector in the wrong orientation, the USB connector will not fit and the USB device will not work. If the user does not know that the USB connector needs to be connected in a particular orientation, the user may use increased insertion pressure, which may damage the USB port and/or the USB connector. Alternately, the user may think that the USB connector is the wrong type of connector.

A USB connector according to the present disclosure remedies the shortcomings of conventional USB connectors by allowing connection in both first and second orientations. The second orientation is rotated 180 degrees relative to the first orientation. As a result, users can connect the USB connector more quickly while avoiding damage to the USB port and/or USB connector.

Referring now to FIGS. 1-4, an exemplary USB connector 10 according to the present disclosure is shown. A USB connector 10 includes a housing 12 having a device or cable-side 14 and a computer port side 16. The USB connector 10 further includes an insulating substrate 24. A plurality of conductors 28-1A, 28-2A, 28-3A, and 28-4A (collectively conductors 28A) are arranged in a spaced relationship on a first side 25 of the insulating substrate 24. The conductor 28-1A is located adjacent to conductor 28-2A. The conductor 28-2A is located adjacent to conductor 28-3A. The conductor 28-3A is located adjacent to conductor 28-4A.

Figure 1:
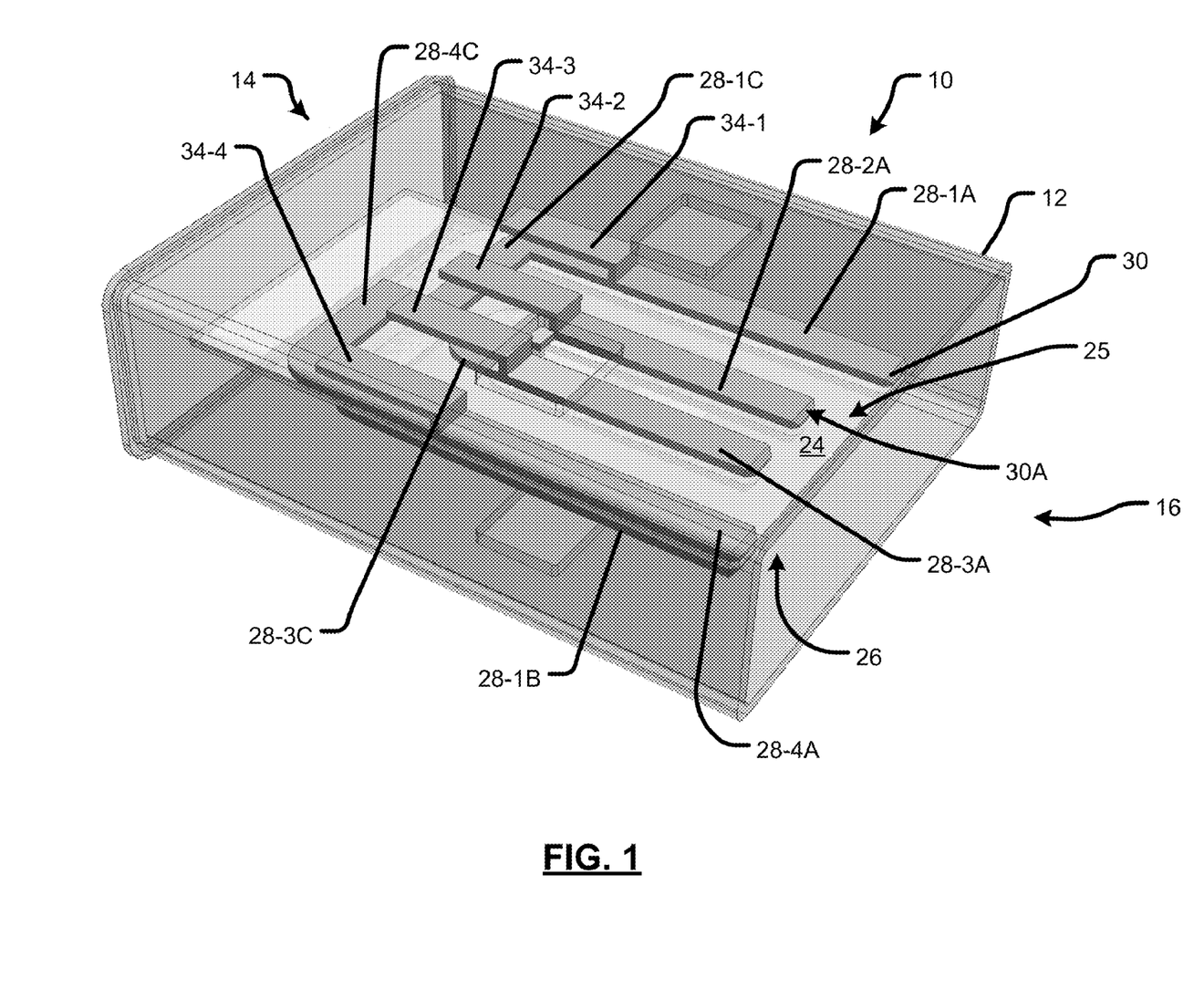
FIG. 1 is a first top perspective view of an exemplary USB connector according to the present disclosure.
Figure 2:
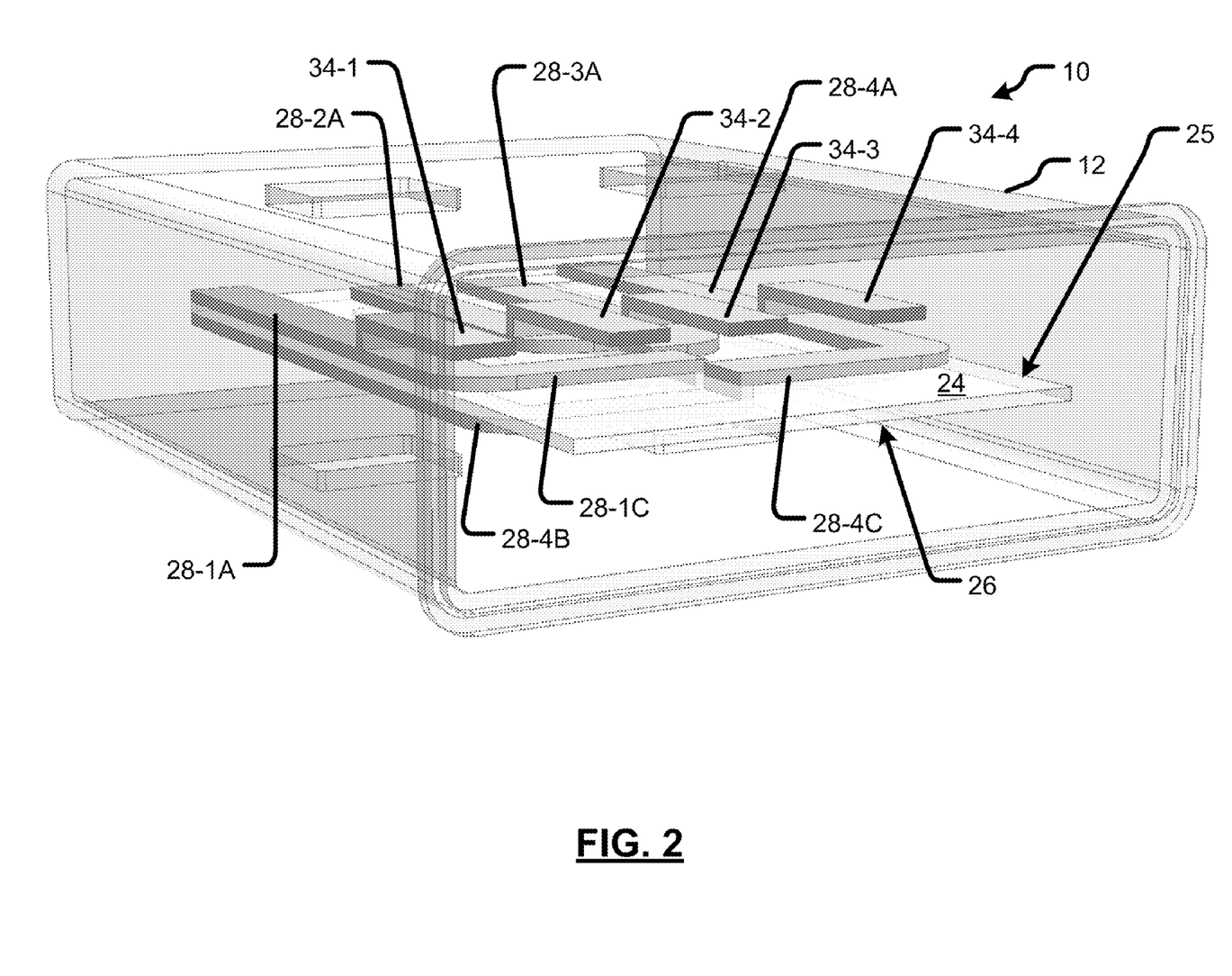
FIG. 2 is a second top perspective view of an exemplary USB connector according to the present disclosure.
Figure 3:
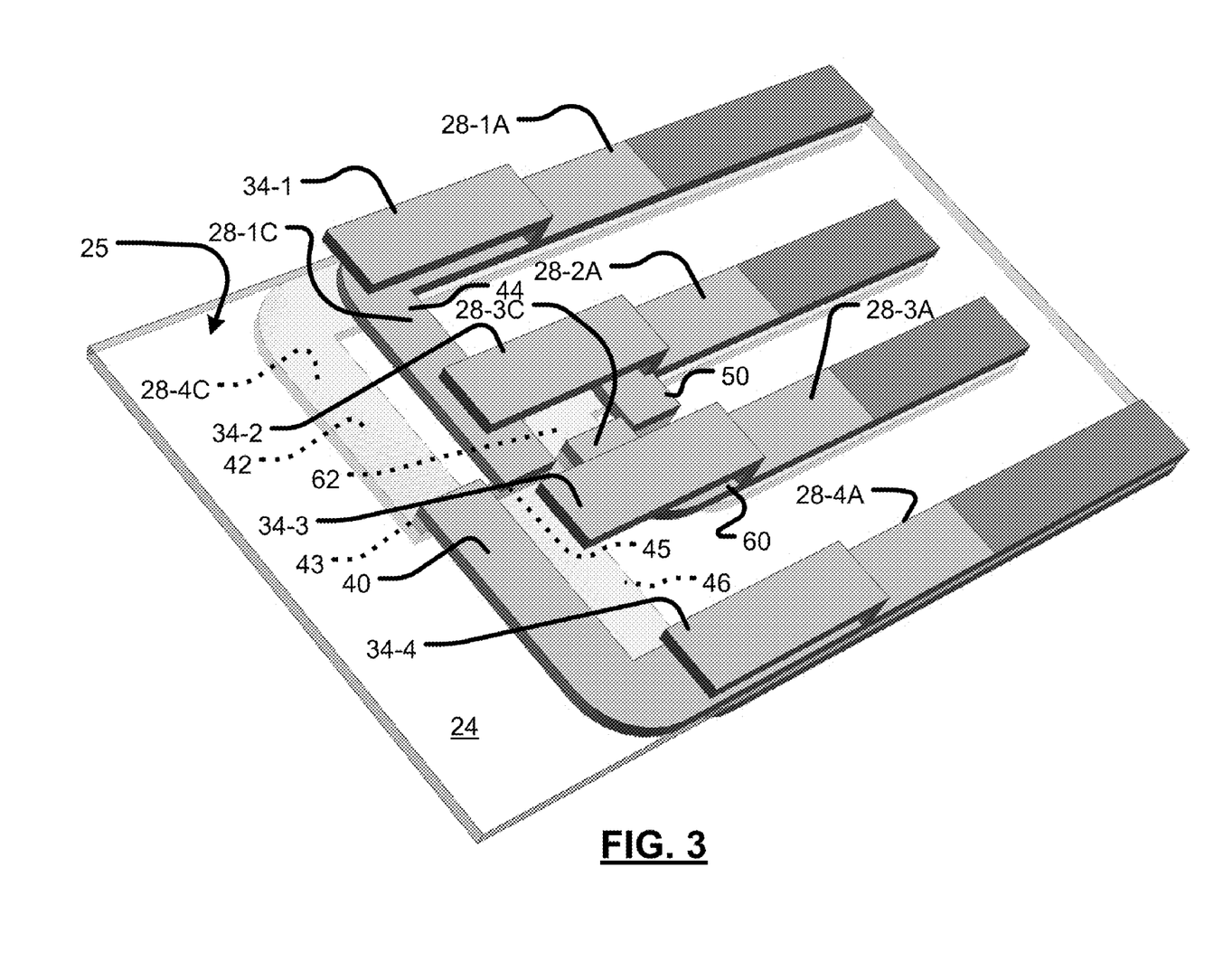
FIG. 3 is a partial top perspective view of an exemplary USB connector without a housing according to the present disclosure.
Figure 4:
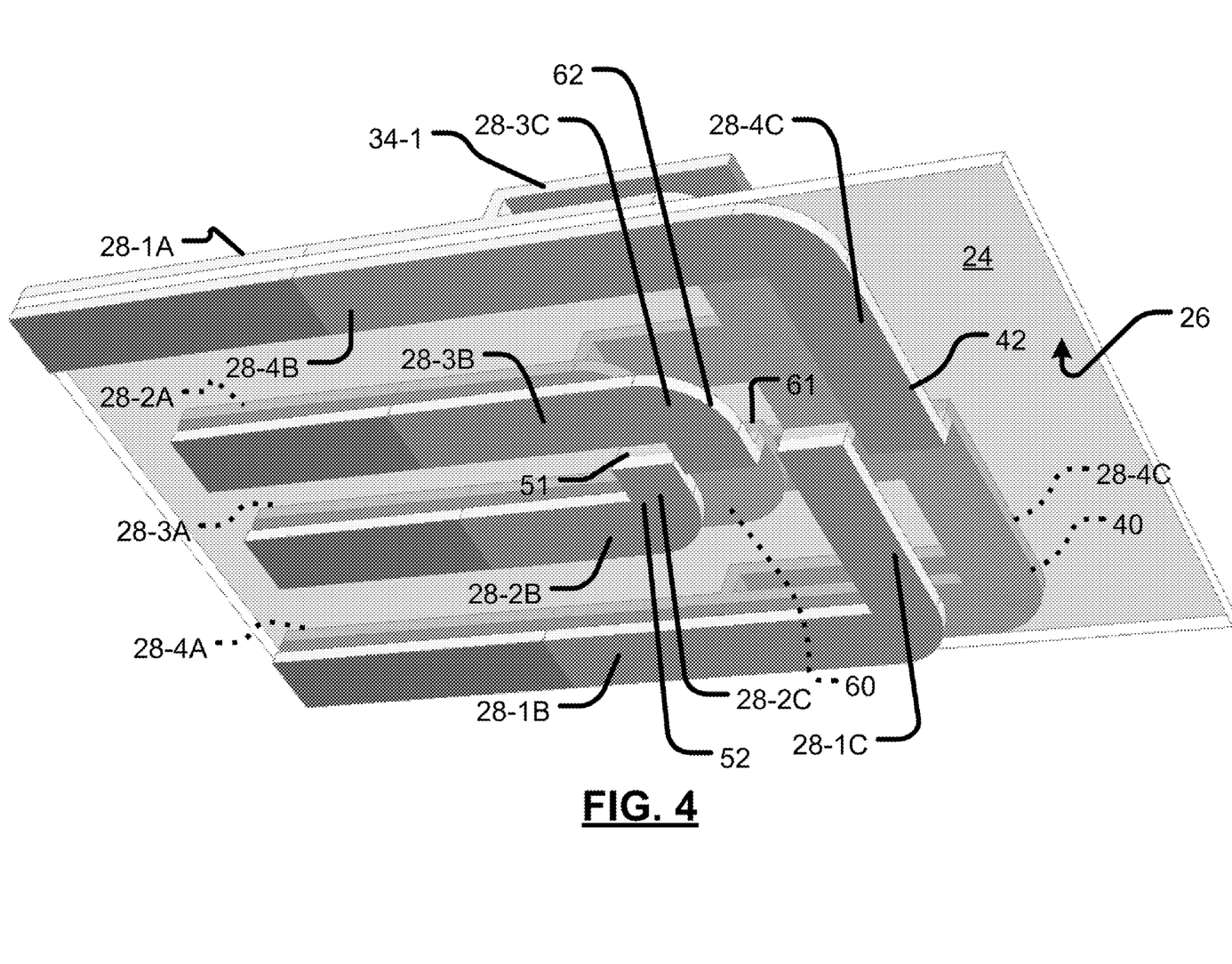
FIG. 4 is a partial bottom perspective view of an exemplary USB connector without a housing according to the present disclosure.
Figure 5:
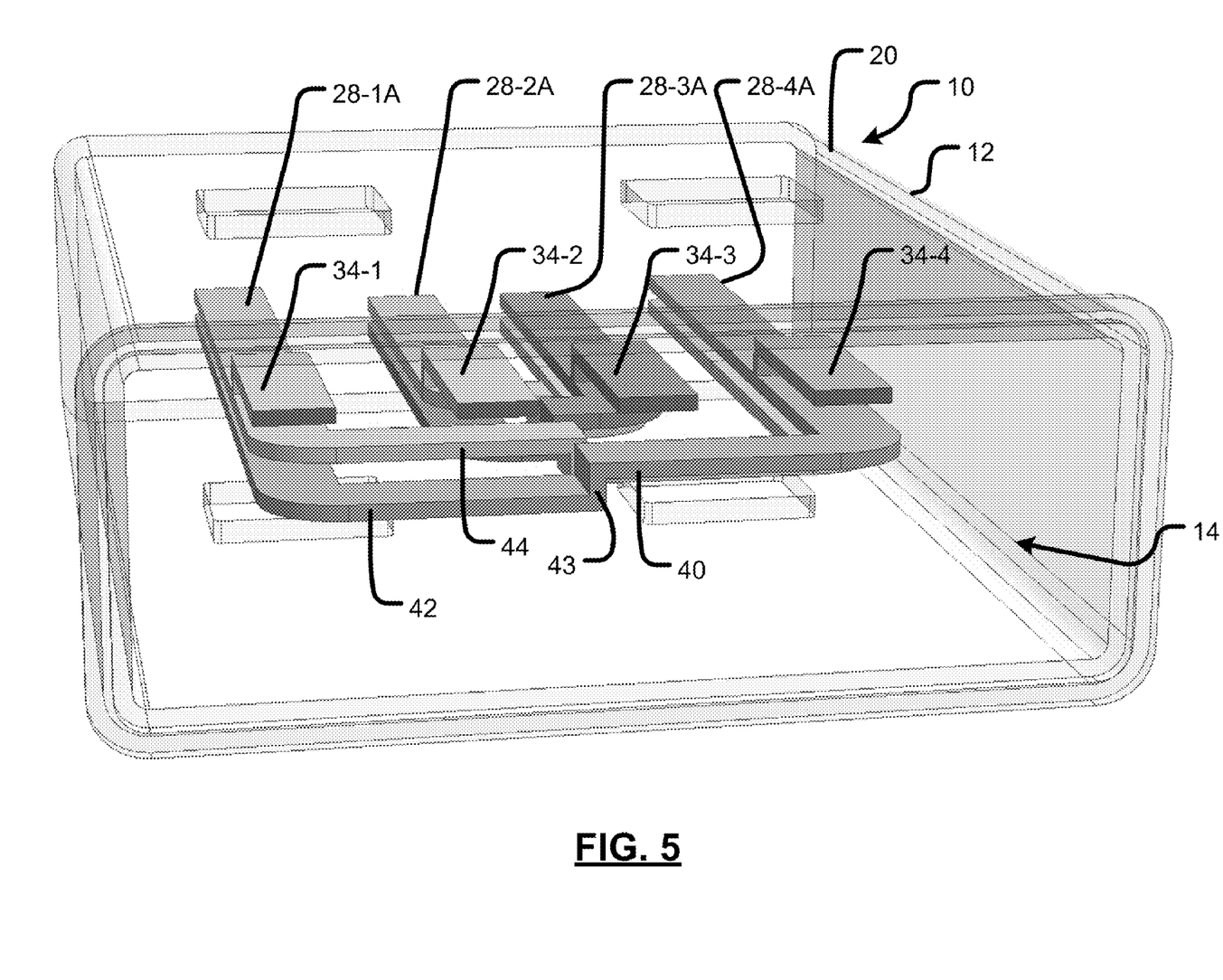
FIG. 5 is a USB cable-side, partial end perspective view of an exemplary USB connector according to the present disclosure.
Figure 6:
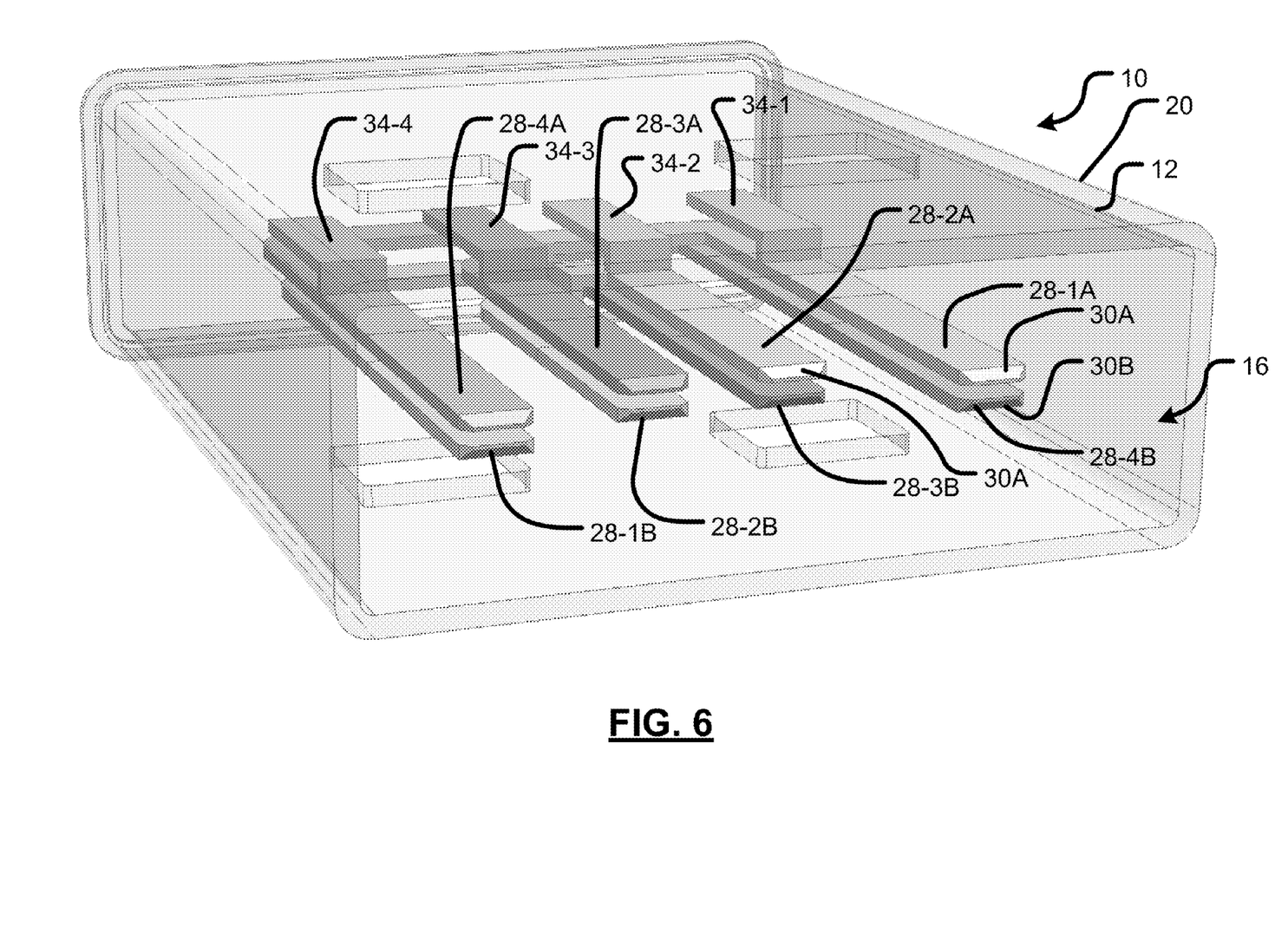
FIG. 6 is a computer-side, partial end perspective view of an exemplary USB connector according to the present disclosure.

A plurality of conductors 28-1B, 28-2B, 28-3B, and 28-4B (collectively conductors 28B) are located in a spaced relationship on a second side 26 of the insulating substrate 24 as best seen in FIG. 4. The conductor 28-1B is located adjacent to conductor 28-2B. The conductor 28-1B is located adjacent to conductor 28-2B. The conductor 28-2B is located adjacent to conductor 28-3B. The conductor 28-3B is located adjacent to conductor 28-4B.

The conductor 28-1A on the first side 25 is located adjacent to the conductor 28-4B located on the opposite side 26. The conductor 28-2A on the first side 25 is located adjacent to the conductor 28-3B located on the opposite side 26. The conductor 28-3A on the first side 25 is located adjacent to the conductor 28-2B located on the opposite side 26. The conductor 28-4A on the first side 25 is located adjacent to the conductor 28-1B located on the opposite side 26.

The conductor 28-1A on the first side 25 is connected by conductor 28-1C to the conductor 28-1B located on the opposite side 26. The conductor 28-2A on the first side 25 is connected by conductor 28-2C to the conductor 28-2B located on the opposite side 26. The conductor 28-3A on the first side 25 is connected by conductor 28-3C to the conductor 28-3B located on the opposite side 26. The conductor 28-4A on the first side 25 is connected by conductor 28-4C to the conductor 28-4B located on the opposite side 26.

Ends of the conductors 28A and 28B on the computer port-side 16 may include a tapered end 30A to facilitate connection to the computer USB port. The conductors 28-1C, 28-2C, 28-3C, and 28-4C (collectively conductors 28C) may pass through the insulating substrate 24. Ends of the conductors 28A and 28B are connected to wires in the USB cable (not shown) by conductors 34-1, 34-2, 34-3 and 34-4 (collectively conductors 34). The conductors 34 may be "L"-shaped and extend upwardly and parallel to conductors 28A and/or 28B. One of the conductors 34 may be connected to supply voltage, another conductor 34 may be connected to ground or another reference potential, another conductor 34 may be connected to one wire of the twisted pair or wires and another conductor 34 may be connected to the other wire of the twisted pair of wires.

Referring now to FIGS. 3-6, the conductor 28-4C has a first "L"-shaped section 40 and a second "L"-shaped section 42 that are connected by a middle section 43 that passes through the insulating material 24. The conductor 28-1C has a first "L"-shaped section 44 and a second "L"-shaped section 46 that are connected by a middle section 45 that passes through the insulating material 24. The conductor 28-2C has a first "L"-shaped section 50 and a second "L"-shaped section 52 that are connected by a middle section 51 that passes through the insulating material 24. The conductor 28-3C has a first "L"-shaped section 60 and a second "L"-shaped section 62 that are connected by a middle section 61 that passes through the insulating material 24.

Figure 7:
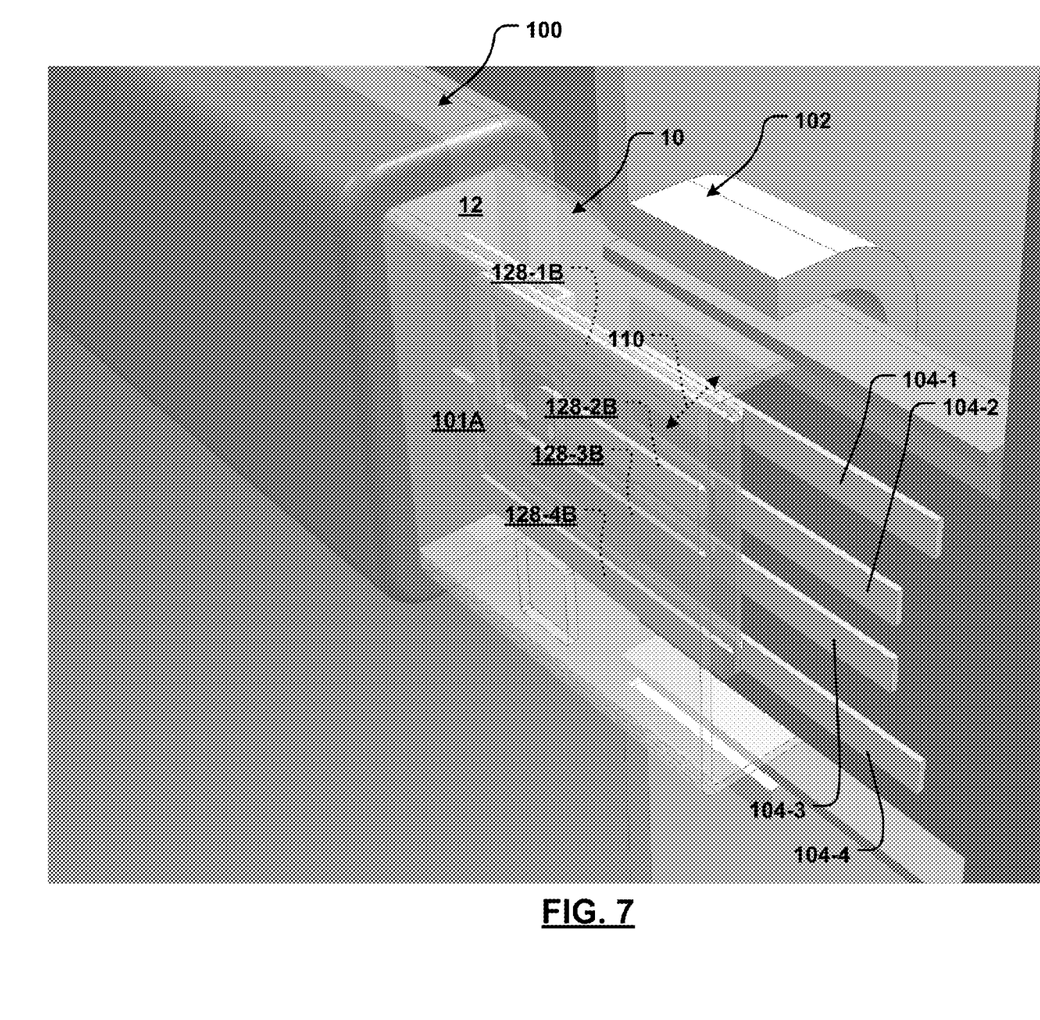
FIG. 7 is a perspective view of an exemplary USB connector according to the present disclosure connected in a first orientation to a computer.
Figure 8:
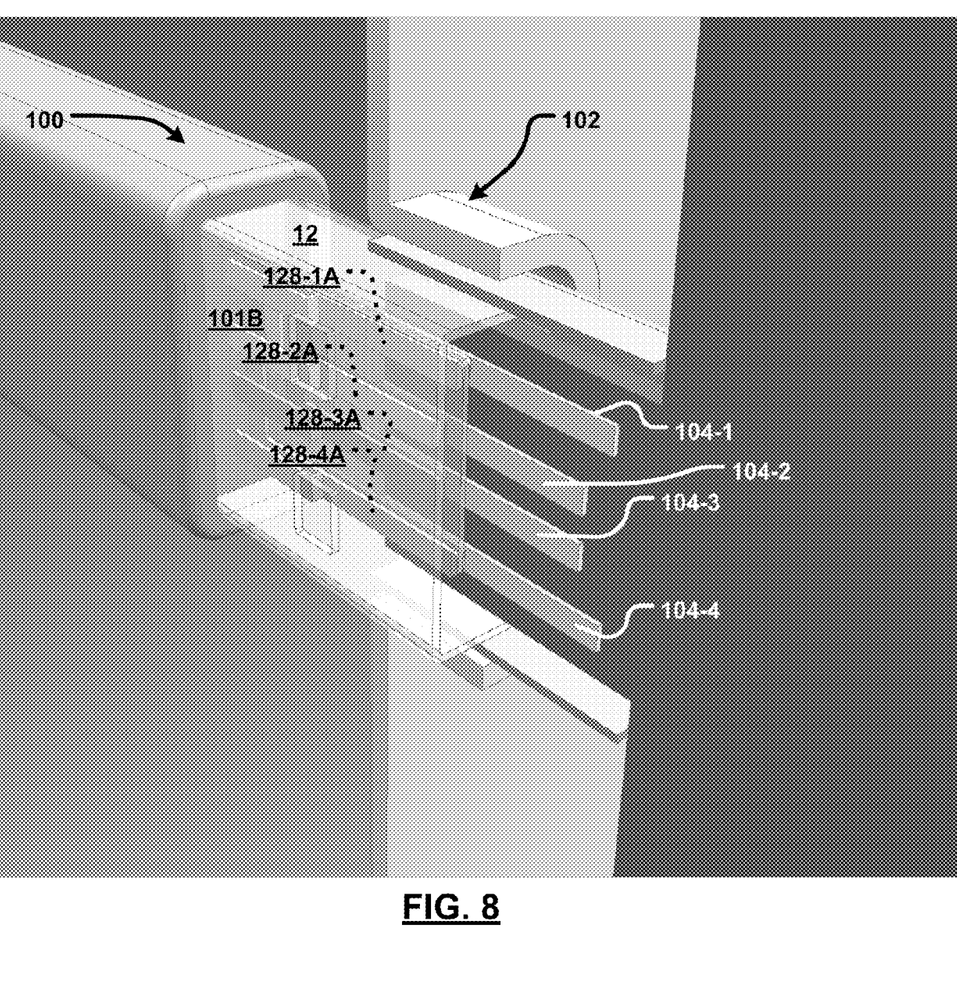
FIG. 8 is a perspective view of an exemplary USB connector according to the present disclosure connected in a second orientation to a computer.
Figure 9:
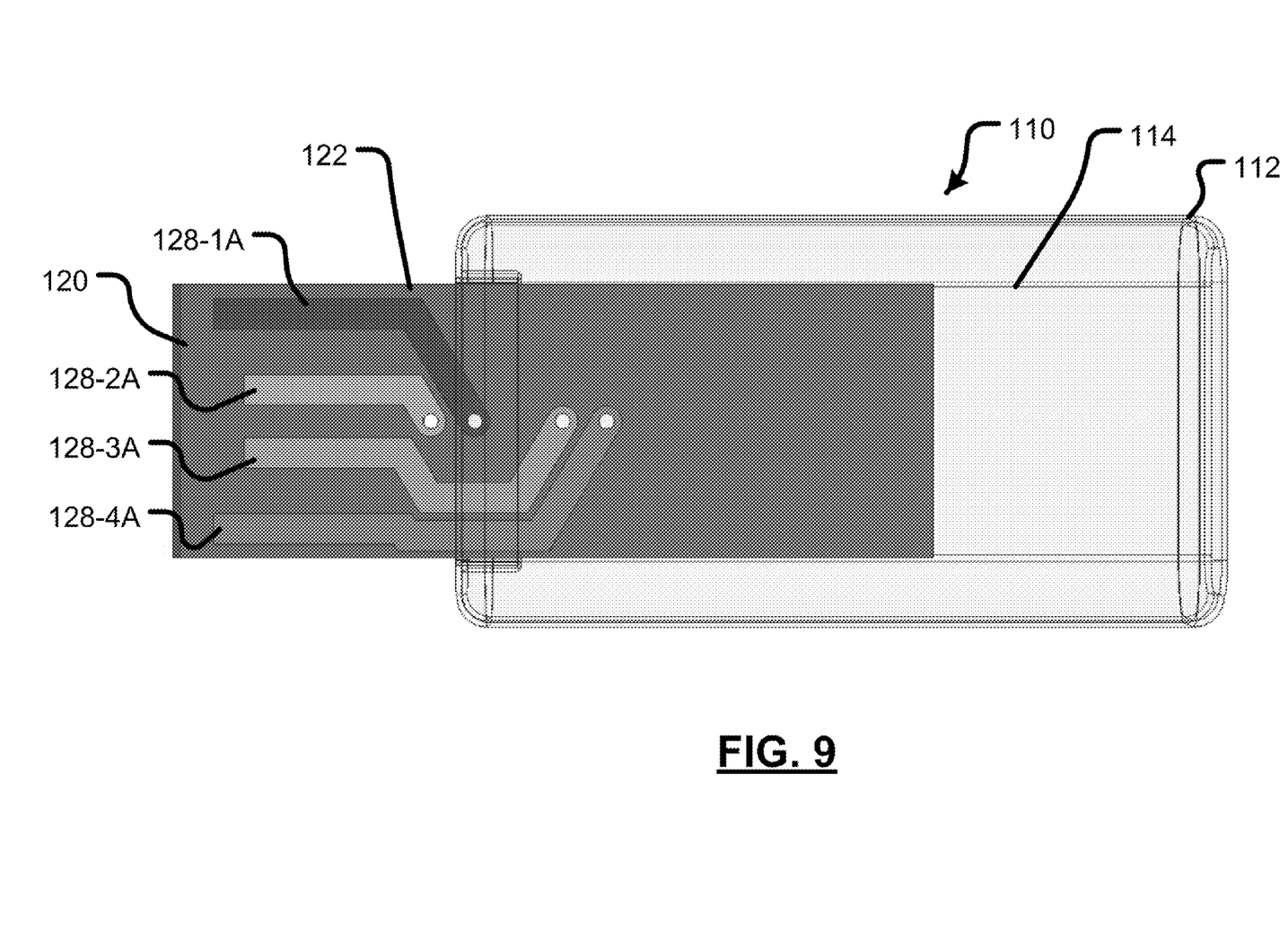
FIG. 9 is a plan view of an exemplary PCB-based USB connector according to the present disclosure.
Figures 10, 11:
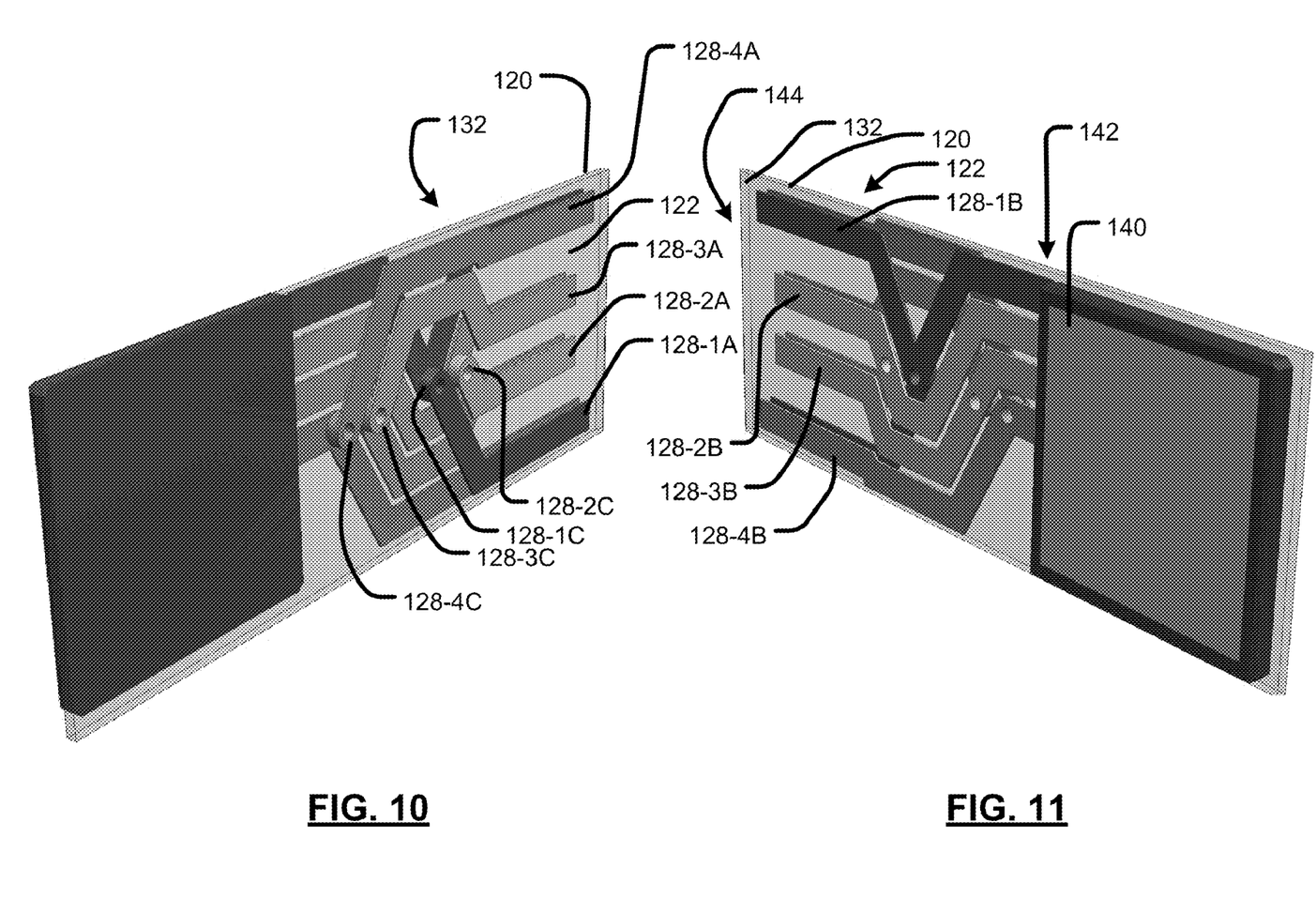
FIG. 10 is a perspective bottom view of an exemplary PCB-based USB connector according to the present disclosure.
FIG. 11 is a perspective top view of an exemplary PCB-based USB connector according to the present disclosure.
Figures 12, 13:
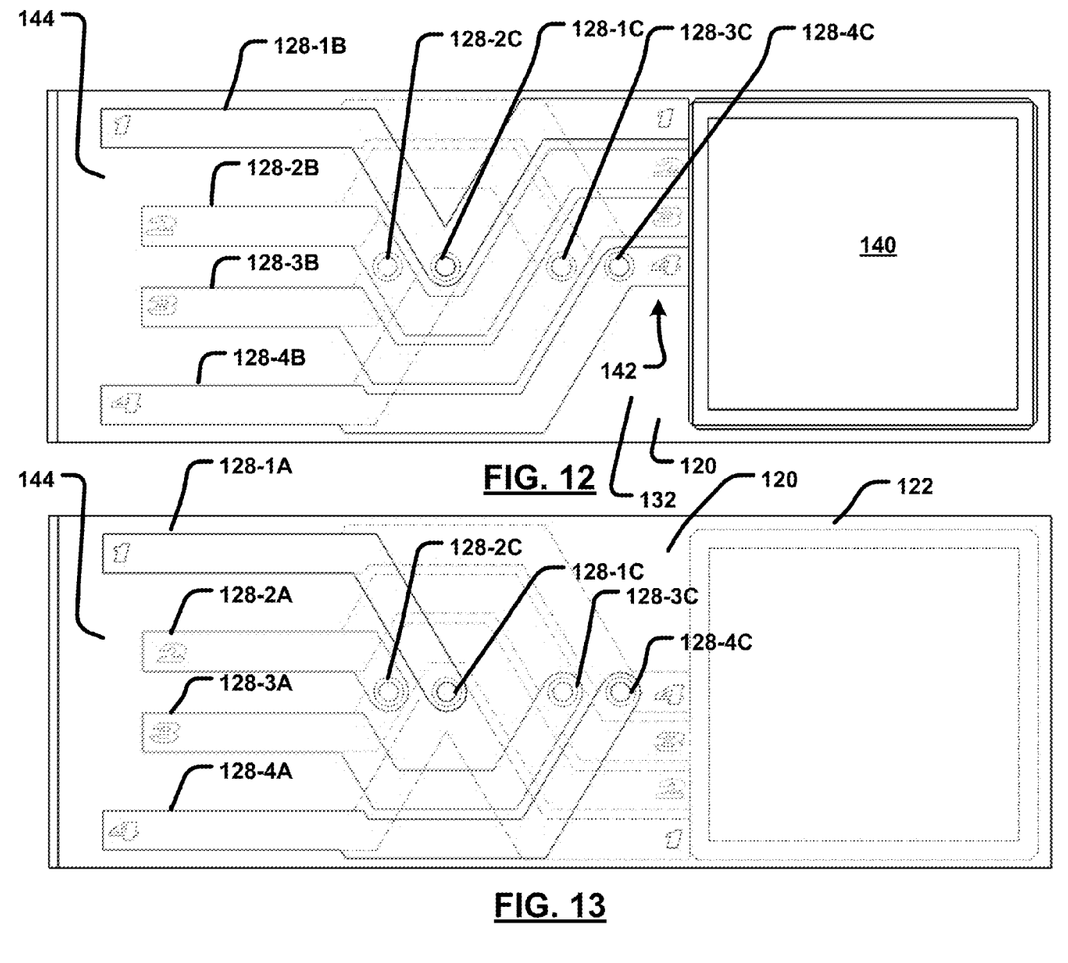
FIG. 12 is a top plan view of an exemplary PCB-based USB connector according to the present disclosure.
FIG. 13 is a bottom plan view of an exemplary PCB-based USB connector according to the present disclosure.

Referring now to FIGS. 7 and 8, the USB connector 10 is shown connected to a cable 100 and to a computer port 102 in a first orientation. A side 101A of the housing 20 is labeled for reference purposes. The computer port 102 provides conductors 104-1, 104-2, 104-3 and 104-4 that mate with conductors 28-1A, 28-2A, 28-3A and 28-4A. Conductors 28-1B, 28-2B, 28-3B and 28-4B are not in direct physical contact with the conductors 104.

In FIG. 8, the USB connector 10 is shown connected to the cable 100 and to the computer port 102 in a second orientation, which is rotated 180 degrees relative to the first orientation. A side 101B of the housing 20, which is opposite to the side 101A, is labeled for reference purposes. The computer port 102 provides conductors 104-1, 104-2, 104-3 and 104-4 that mate with (directly physically contact) conductors 28-1B, 28-2B, 28-3B and 28-4B. Conductors 28-1A, 28-2A, 28-3A and 28-4A are not in direct physical contact with the conductors 104. In both cases, the conductor 34 is associated with the conductor 28A or 28B via the conductors 28C. As a result, the wires in the cable 100 are always connected to the correct input of the computer port.

Referring now to FIGS. 9-13, a PCB-based USB connector according to the present disclosure is shown. The USB connector 110 includes a housing 112 that defines a slot 114 for receiving a printed circuit board 120. Other mechanical attachment methods may be used to support the printed circuit board 120 within the housing 112. A first surface 122 of the printed circuit board 120 includes traces 128-1A, 128-2A, 128-3A, and 128-4A. A second surface 132 of the printed circuit board 120 includes traces 128-1B, 128-2B, 128-3B, and 128-4B. In this exemplary implementation, a circuit 140 such as an integrated circuit including memory, a hard disk drive or any other circuit is connected to ends 142 of the conductors 128. Opposite ends 144 of the conductors 128 are connected to a computer port. However, a USB cable and/or any other type of device may be connected.

Figure 14:
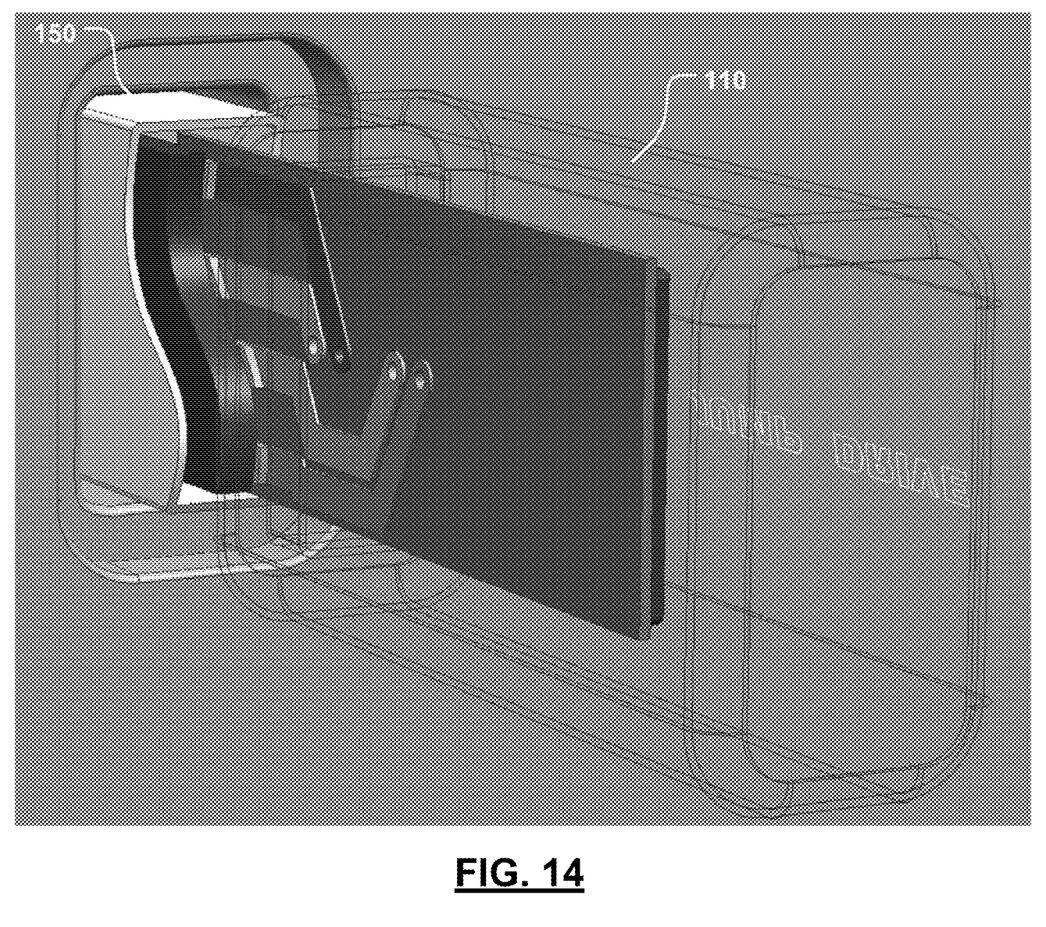
FIG. 14 is a bottom perspective view of the PCB-based USB connector attached to a computer in a first orientation.
Figure 15:
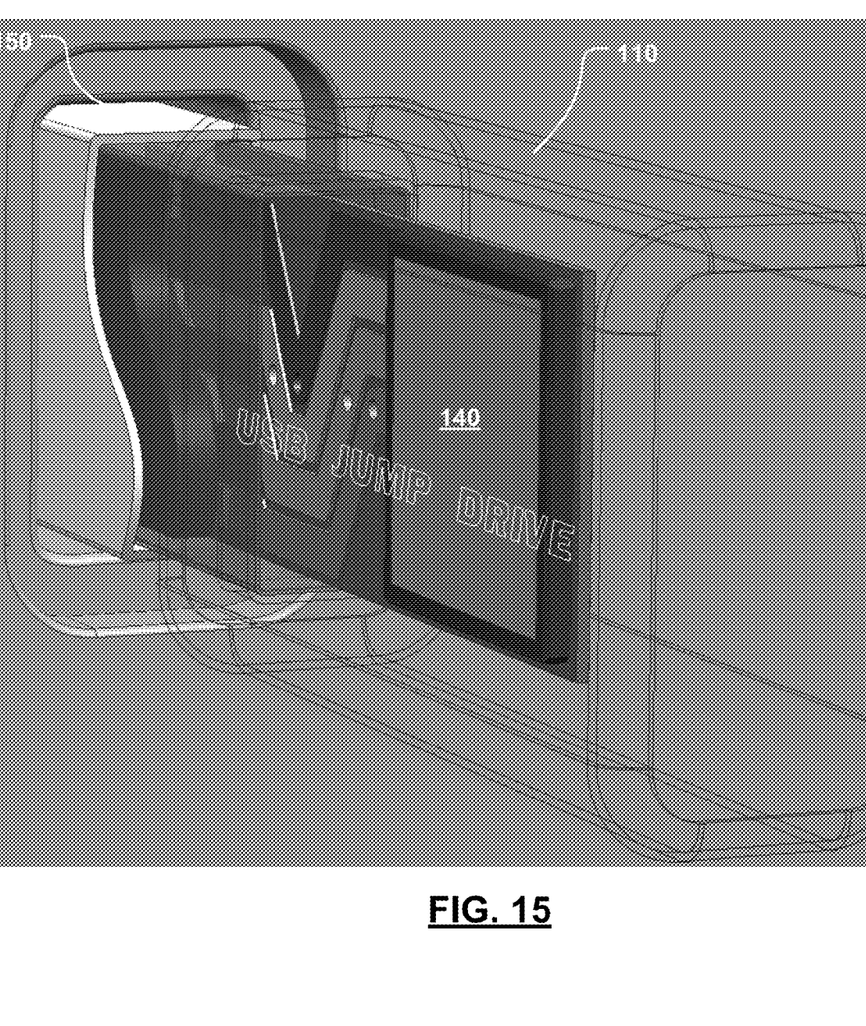
FIG. 15 is a top perspective view of the PCB-based USB connector attached to a computer in a second orientation.

Referring now to FIGS. 14-15, the USB connector 110 is shown connected to a computer port 150 in first and second orientations.

Figure 16:
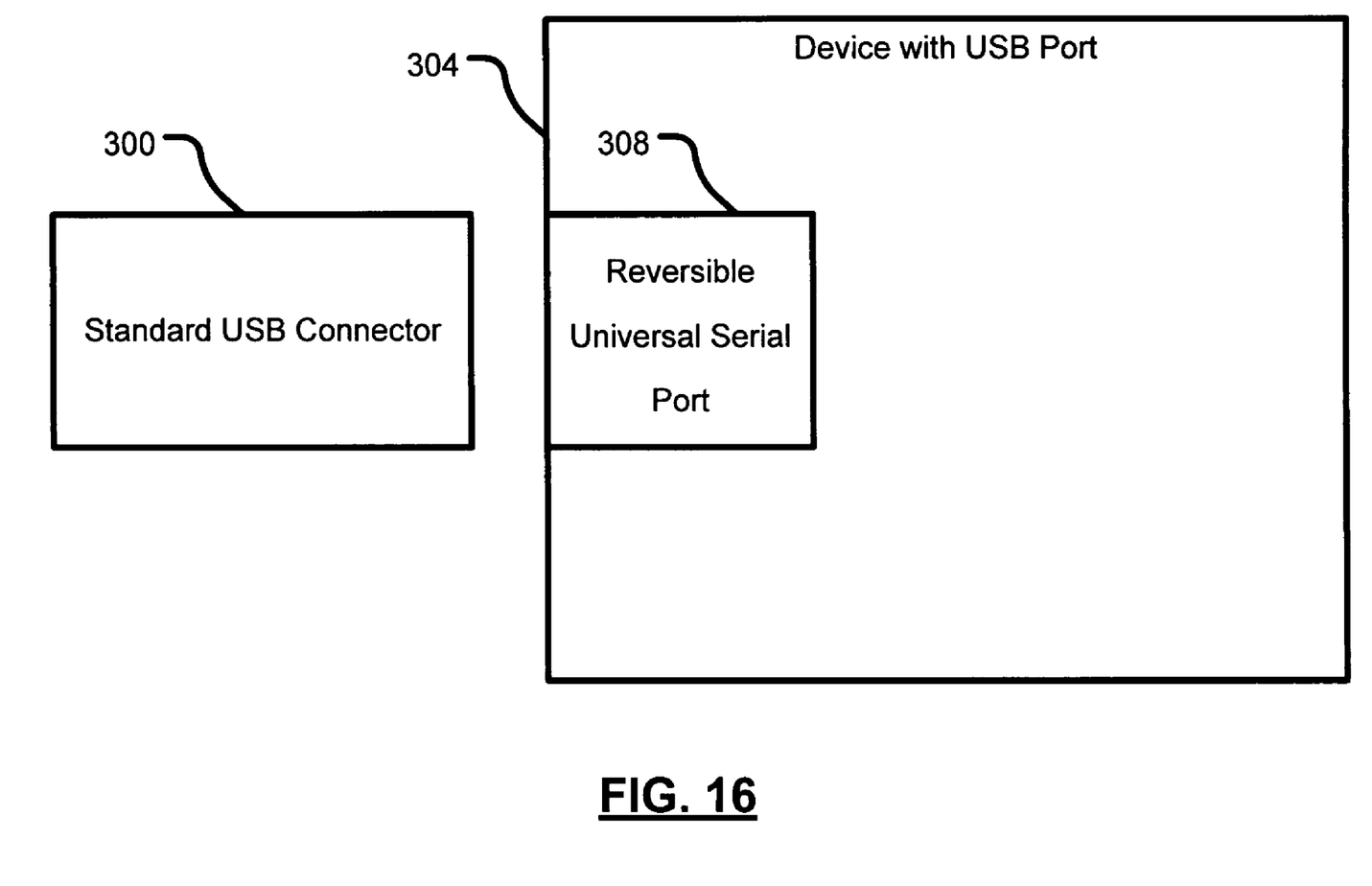
FIG. 16 is a functional block diagram of a device with a reversible USB port according to the present disclosure.

Referring now to FIG. 16, a standard USB connector 300 can be connected to a reversible USB Port 308 of a device 304. The USB Port 308 can be constructed in a manner similar to the USB connectors described above.

As can be appreciated from the foregoing, the USB connector according to the present disclosure simplifies the connection of a USB device or USB cable to a computer port. While a computer port is shown, the USB connector can be connected to any computing device with a USB port in either the first or second orientation while maintaining the proper orientation of the connections relative to the port of the computing device.

What is claimed is:

1. A universal serial bus (USB) interface connection for one of a USB connector and a USB port of a device, comprising a printed circuit board including a first side and a second side;

first, second, third and fourth traces arranged adjacent to each other on said first side of said printed circuit board and having a port side and a second side;

first, second, third and fourth traces arranged adjacent to each other on said second side of said printed circuit board and having a port side and a second side; and first, second, third and fourth connecting vias, wherein at least part of said first trace on said first side is adjacent to said fourth trace on said second side, at least part of said second trace on said first side is adjacent to said third trace on said second side, at least part of said third trace on said first side is adjacent to said second trace on said second side, and at least part of said fourth trace on said first side is adjacent to said first trace on said second side, and wherein said first traces on said first and second sides are connected by said first connecting via, said second traces on said first and second sides are connected by said second connecting via, said third traces on said first and second sides are connected by said third connecting via, and said fourth traces on said first and second sides are connected by said fourth connecting via.

2. The USB interface connection of claim 1 wherein said first traces are connected to a first conductor of a USB cable, wherein said second traces are connected to a second conductor of a USB cable, wherein said third traces are connected to a third conductor of a USB cable, and wherein said fourth traces are connected to a fourth conductor of a USB cable.

3. The USB interface connection of claim 1 further comprising a housing including a slot that receives the printed circuit board.

4. A system comprising the USB interface connection of claim 1 and further comprising at least one of a hard disk drive and memory connected to said second ends of said first, second, third and fourth traces.

5. Apparatus comprising the USB interface connection of claim 1 and further comprising a USB cable including first, second, third and fourth wires that are connected to said first, second, third and fourth traces.

6. A system comprising the USB interface connection of claim 1 and further comprising a circuit connected to said second ends of said first, second, third and fourth traces.

* * * * *